(12) United States Patent
Xu et al.

(10) Patent No.: US 11,282,985 B2
(45) Date of Patent: Mar. 22, 2022

(54) FLIP-CHIP LED CHIP USED IN BACKLIGHT AND PRODUCTION METHOD THEREOF

(71) Applicant: FOSHAN NATIONSTAR SEMICONDUCTOR CO., LTD, Guangdong (CN)

(72) Inventors: Liang Xu, Guangdong (CN); Caixia Jin, Guangdong (CN); Cheng Li, Guangdong (CN); Chiaming Chuang, Guangdong (CN)

(73) Assignee: FOSHAN NATIONSTAR SEMICONDUCTOR CO., LTD, Foshan (CN)

( * ) Notice: Subject to any disclaimer, the term of this patent is extended or adjusted under 35 U.S.C. 154(b) by 0 days.

(21) Appl. No.: 16/766,702

(22) PCT Filed: Apr. 30, 2019

(86) PCT No.: PCT/CN2019/085328
§ 371 (c)(1),
(2) Date: May 24, 2020

(87) PCT Pub. No.: WO2020/015437
PCT Pub. Date: Jan. 23, 2020

(65) Prior Publication Data
US 2020/0388728 A1 Dec. 10, 2020

(30) Foreign Application Priority Data

Jul. 17, 2018 (CN) .......................... 201810782951.7
Mar. 29, 2019 (CN) .......................... 201910246248.9

(51) Int. Cl.
*H01L 33/46* (2010.01)
(52) U.S. Cl.
CPC .... *H01L 33/465* (2013.01); *H01L 2933/0025* (2013.01)

(58) Field of Classification Search
CPC ....... H01L 33/465; H01L 33/10; H01L 33/60; H01L 2933/0025
See application file for complete search history.

(56) References Cited

U.S. PATENT DOCUMENTS

2011/0284822 A1* 11/2011 Jung ...................... H01L 33/56
257/13

FOREIGN PATENT DOCUMENTS

CN          1409414 A      4/2003
CN          102640308 A    8/2012

OTHER PUBLICATIONS

International Search Report of PCT Patent Application No. PCT/CN2019/085328 dated Jul. 4, 2019.

* cited by examiner

*Primary Examiner* — Latanya N Crawford Eason

(57) ABSTRACT

The present invention discloses a flip-chip LED chip used in a backlight and a producing method thereof. The flip-chip LED chip used in the backlight comprises a substrate, an epitaxial layer, a transparent conductive layer, an insulating layer, a first reflecting layer, a second reflecting layer, a first electrode, and a second electrode. In the present invention, the first reflecting layer and the second reflecting layer are formed on both sides of the substrate. By adjusting the reflectance of the first reflecting layer and the second reflecting layer, the light emitted by the epitaxial layer is reflected by the first reflecting layer and the second reflecting layer, resulting in 20-40% of the light being emitted from the back of the chip, and 60-80% of the light being emitted from the side of the chip. This increases the light uniformity of the LED backlight.

9 Claims, 2 Drawing Sheets

FLIP-CHIP LED CHIP USED IN BACKLIGHT AND PRODUCTION METHOD THEREOF

FIELD OF THE INVENTION

This invention relates to the field of light-emitting diodes, and in particular to a flip-chip LED chip used for a backlight and a production method thereof.

BACKGROUND OF THE INVENTION

Liquid-crystal displays (LCDs) show different colors through liquid-crystal molecules refracting light from a backlight. Liquid-crystal molecules cannot emit light by themselves; light emission is mainly achieved by the backlight. The backlight of most LCDs is CCFLs (cold-cathode fluorescent lamps), and their operating principle is similar to a fluorescent tube. The LED backlight is a new type of backlight that can replace CCFLs.

Employing LEDs as the backlight brings the following advantages:

First, more uniform light emission. As CCFL backlight tubes are usually bar-shaped or U-shaped, they are prone to uneven light emission. However, LED backlights operate according to a different principle; their luminous elements are evenly distributed, alleviating the problem of uneven light emission.

Second, longer lamp life. The lamp life of an ordinary CCFL backlight is 50,000 hours, while the lamp life of an LED is greater than 100,000 hours. Therefore, after prolonged use of an LCD screen or an LCD TV employing an LED backlight, the problem of brightness attenuation of the LED backlight is less severe than that of a CCFL backlight.

Third, more environmentally friendly. In the case of the CCFL backlight, mercury, a toxic substance, is always present because of the light emission principle of the CCFL backlight. This is obvious when taking a look at ordinary fluorescent tubes: such tubes all contain mercury. CCFL backlights, which are similar to the fluorescent tube in their light emission principle, naturally also have the problem of mercury presence. LEDs, on the other hand, do not have this problem. Another point worth noting is that LED-backlit screens are more energy-efficient than CCFL-backlit screens. Taking a 21.6-inch screen as an example, the power consumption of a LED-backlit LCD screen is about 60% of that of a CCFL-backlit screen.

Existing LED backlights generally consist of LED chips having a flip-chip structure. An existing flip-chip LED chip generally forms a reflecting layer on a transparent conductive layer. The reflecting layer reflects light emitted from the active layer to the side of the substrate for emission, thereby increasing the brightness of the chip. The LED backlight is composed of multiple flip-chip LED chips with a certain gap between adjacent chips. As existing flip-chip LED chips emit light through their back surface, the LED backlight has bright and dark areas; that is, the light-emitting areas of the chip give rise to the bright areas, while the areas between adjacent chips give rise to the dark areas. This leads to uneven light emission of the backlight.

SUMMARY OF THE INVENTION

The objective of the present invention is to provide a flip-chip LED chip used for a backlight, which increases the amount of light emitted from the side of the chip and increases light uniformity of the LED backlight.

Another objective of the present invention is to increase the light output efficiency of the back of the chip.

Another objective of the present invention is to provide a method for producing a flip-chip LED chip used for a backlight. The method is simple and allows effective control of the light output of the chip at various angles, increasing the light uniformity of the LED backlight.

The technical solutions of the present application are as follows:

A flip-chip LED chip used for a backlight, comprising a substrate, an epitaxial layer, a transparent conductive layer, an insulating layer, a first reflecting layer, a second reflecting layer, a first electrode, and a second electrode; the epitaxial layer is disposed on a surface of the substrate, the transparent conductive layer is disposed on the epitaxial layer, the insulating layer is disposed on the transparent conductive layer, the first reflecting layer is disposed on the insulating layer, and the second reflecting layer is disposed on a back surface of the substrate; the first electrode is electrically connected to the epitaxial layer, the second electrode is electrically connected to the transparent conductive layer; reflectance of the second reflecting layer is greater than that of the first reflecting layer, and the reflectance of the first reflecting layer is less than or equal to 80%; after light emitted from the epitaxial layer is reflected by the first reflecting layer and the second reflecting layer, 20% to 40% of the light is emitted from a back surface of the chip, and 60% to 80% of the light is emitted from a side of the chip.

As an improvement of the technical solution above, it further comprises a light-inducing layer, the light-inducing layer is disposed between the substrate and the second reflecting layer, a refractive index of the light-inducing layer is smaller than that of the substrate, and a wavelength of light emitted from the epitaxial layer is an integer multiple of a thickness of the light-inducing layer.

As an improvement of the technical solution above, the light-inducing layer has a single-layer structure or a multi-layer structure.

As an improvement of the technical solution above, the light-inducing layer comprises a first light-emitting layer, a second light-emitting layer, and a third light-emitting layer that are consecutively disposed on the substrate, wherein a refractive index of the third light-emitting layer<a refractive index of the second light-emitting layer<a refractive index of the first light-emitting layer<a refractive index of the substrate.

As an improvement of the technical solution above, the substrate is a sapphire substrate; the light-inducing layer includes a first $Al_2O_3$ layer, a second $Al_2O_3$ layer, and a third $Al_2O_3$ layer consecutively disposed on the sapphire substrate, wherein a refractive index of the third $Al_2O_3$ layer<a refractive index of the second $Al_2O_3$ layer<a refractive index of the first $Al_2O_3$ layer<a refractive index of the sapphire substrate.

As an improvement of the technical solution above, the substrate is a sapphire substrate; the light-inducing layer includes an $Al_2O_3$ layer, a $SiO_2$ layer, and a $MgF_2$ layer consecutively disposed on the sapphire substrate, wherein a refractive index of the $MgF_2$ layer<a refractive index of the $SiO_2$ layer<a refractive index of the $Al_2O_3$ layer<a refractive index of the sapphire substrate.

As an improvement of the technical solution above, a hole is provided in the light-inducing layer, the hole penetrates from a surface of the light-inducing layer to an inside of the light-inducing layer; or the hole penetrates from the surface of the light-inducing layer to the back surface of the substrate; or the hole penetrates from the surface of the light-inducing layer to the surface of the substrate.

As an improvement of the technical solution above, the first reflecting layer is a Bragg reflecting layer, and is made from one or more materials selected from the group consisting of $SiO_2$, $Si_3N_4$, $Al_2O_3$, $TiO_2$, and $Ta_2O_3$.

As an improvement of the technical solution above, the second reflecting layer is a Bragg reflecting layer or a metal reflecting layer, and is made from one or more materials selected from the group consisting of $SiO_2$, $Si_3N_4$, $Al_2O_3$, $TiO_2$, $Ta_2O_3$, Al, and Ag.

As an improvement of the technical solution above, reflectance of the first reflecting layer to light having a wavelength of 400-500 nm is less than 80%.

Accordingly, the present invention provides a method for producing a flip-chip LED chip used in a backlight, comprising forming an epitaxial layer on a surface of a substrate;

forming a transparent conductive layer on the epitaxial layer;

forming an insulating layer on the transparent conductive layer;

forming a first reflecting layer on the insulating layer;

forming a second reflecting layer on a back surface of the substrate, reflectance of the second reflecting layer is greater than that of the first reflecting layer, and reflectance of the first reflecting layer is less than or equal to 80%;

Forming a First Electrode and a Second Electrode.

As an improvement of the technical solution above, forming a light-inducing layer on the back surface of the substrate before forming the second reflecting layer; forming the second reflecting layer on the light-inducing layer.

The beneficial effects of the present invention are as follows:

1. The present invention provides a flip-chip LED chip used in a backlight, which comprises a substrate, an epitaxial layer, a transparent conductive layer, an insulating layer, a first reflecting layer, a second reflecting layer, a first electrode, and a second electrode. In the present invention, the first reflecting layer and the second reflecting layer are formed on both sides of the substrate. By adjusting the reflectance of the first reflecting layer and the second reflecting layer, the light emitted by the epitaxial layer is reflected by the first reflecting layer and the second reflecting layer, resulting in 20-40% of the light being emitted from the back of the chip, and 60-80% of the light being emitted from the side of the chip. This increases the light uniformity of the LED backlight.

2. The present invention provides a light-inducing layer having a lower refractive index than that of the substrate provided between the second reflecting layer and the substrate. This reduces the total reflection of the substrate, induces more light onto the light-inducing layer, and increases the light emission efficiency of the chip.

3. In the present invention, a plurality of holes is provided in the light-inducing layer, which allows more light to flow out from the light-inducing layer, further increasing the light emission efficiency at the back of the chip.

DETAILED DESCRIPTION OF THE ILLUSTRATED EMBODIMENTS

To further clarify the objectives, technical solutions, and beneficial effects of the present invention, the present invention will be described in further detail below with reference to the drawings.

Figure 1:
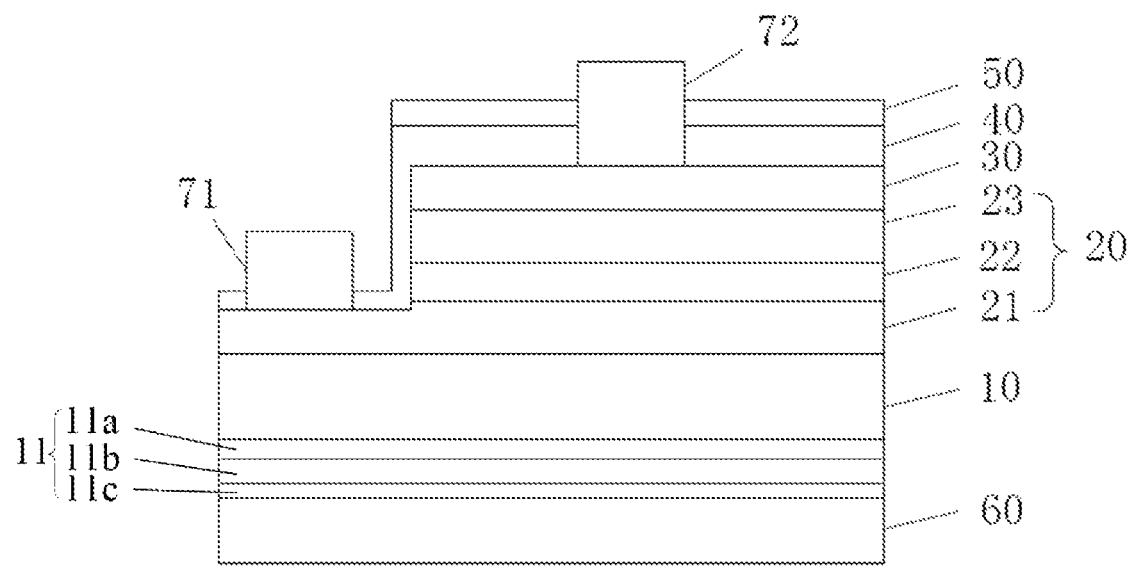
FIG. 1 is a structural diagram showing the flip-chip LED chip used in a backlight according to the present invention.

Referring to FIG. 1, a flip-chip LED chip used in a backlight provided by the present invention comprises a substrate 10, an epitaxial layer 20, a transparent conductive layer 30, an insulating layer 40, a first reflecting layer 50, a second reflecting layer 60, a first electrode 71 and a second electrode 72. The flip-chip LED chip of the present invention can be used in an LED backlight source.

The material of the substrate 10 may be sapphire, silicon carbide, or silicon. Other semiconductor materials may also be used. The substrate in this embodiment is preferably a sapphire substrate.

The epitaxial layer 20 is provided on the surface of the substrate 10. The epitaxial layer 20 includes a first semiconductor layer 21 provided on the surface of the substrate 10, an active layer 22 provided on the first semiconductor layer 21, and a second semiconductor layer 23 provided on the active layer 22.

Specifically, the first semiconductor layer 21 and the second semiconductor layer 23 of the present invention are both gallium nitride-based semiconductor layers, the active layer 22 is a gallium nitride-based active layer, but is not limited thereto.

It should be noted that in other embodiments of the present application, a buffer layer is provided between the substrate 10 and the epitaxial layer 20.

To prevent the carriers of the LED chip from clustering and to increase the light-emitting efficiency of the chip, the present invention provides a transparent conductive layer 30 between the second semiconductor layer 23 and the second electrode 72, wherein the material of the transparent conductive layer 30 is indium tin oxide.

To protect the LED chip and to prevent the chip from forming short circuits, the insulating layer 40 is disposed on the surface of the transparent conductive layer 30 and extends to the sidewall of the epitaxial layer.

The first reflecting layer 50 is disposed on the insulating layer 40; the reflectance of the first reflecting layer 50 is less than or equal to 80%. To facilitate the adjustment of the reflectance of the first reflecting layer 50, the first reflecting layer 50 is a Bragg reflecting layer, and is made from one or more of the materials selected from the group consisting of $SiO_2$, $Si_3N_4$, $Al_2O_3$, $TiO_2$, and $Ta_2O_3$. To further facilitate the adjustment of the reflectance of the first reflecting layer 50, the first reflecting layer 50 has a multilayer structure, and the reflectance of the first reflecting layer 50 can be adjusted by adjusting its layered structure. The reflectance of the first reflecting layer 50 is adjusted according to the size of the chip and the distance between adjacent chips.

Preferably, the reflectance of the first reflecting layer 50 is 80% or less. More preferably, the reflectance of the first reflecting layer 50 is 30-70%. Specifically, the reflectance of the first reflecting layer 50 is 30%, 40%, 50%, 60%, 70%, or 80%.

Since the chip of the present invention is employed in an LED backlight source, the reflectance of the first reflecting layer 50 to 400-500 nm light is less than or equal to 80%. More preferably, the reflectance of the first reflecting layer 50 to 400-500 nm light is 30-70%.

Figure 2:
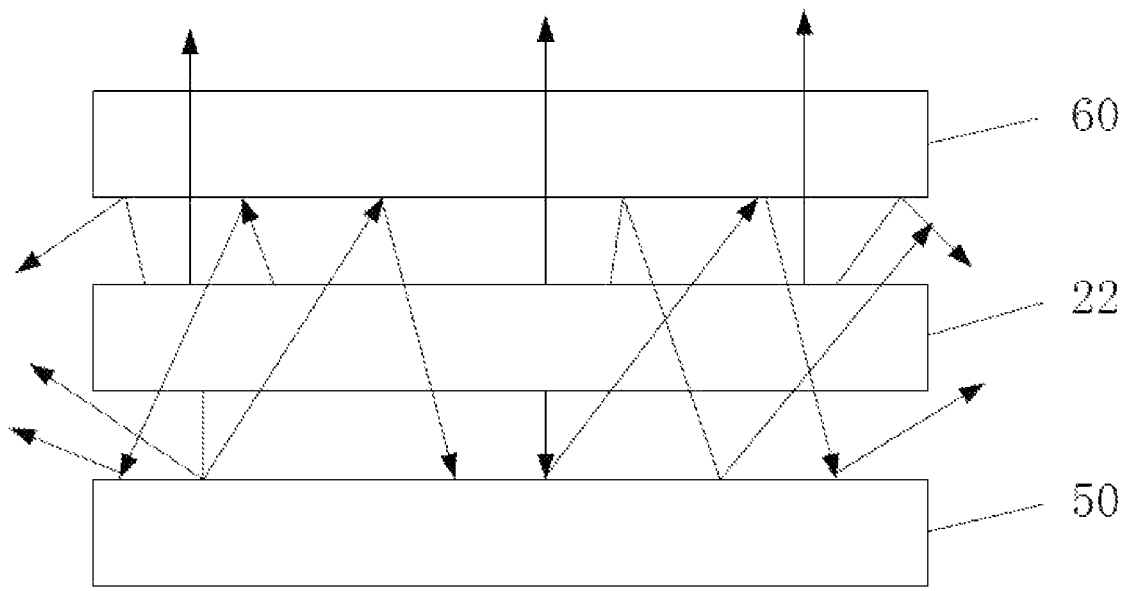
FIG. 2 is a diagram illustrating light emission of the flip-chip LED chip used in a backlight according to the present invention.

The second reflecting layer 60 is disposed on the back surface of the substrate 10; the reflectance of the second reflecting layer 60 is greater than that of the first reflecting layer 50. Referring to FIG. 2, after light emitted from the active layer 23 passes through the first reflecting layer 50 and the second reflecting layer 60, 20% to 40% of the light is emitted from the back of the chip, and 60% to 80% of the light is emitted from the side of the chip. In this way, the light intensity of the light-emitting area at the back of the chip can be controlled, and no bright areas are formed. Meanwhile, the light-emitting area at the side of the chip can also be controlled. The light intensity at the side of the chip can be increased or decreased by adjusting the reflectance of the first reflecting layer 50, thereby preventing the formation of dark areas in the area between the chips after the chip is packaged, thus increasing the light uniformity of the LED backlight.

The second reflecting layer 60 is a Bragg reflecting layer or a metal reflecting layer and is made from one or more materials selected from the group consisting of $SiO_2$, $Si_3N4$, $Al_2O_3$, $TiO_2$, $Ta_2O_3$, Al, and Ag. Preferably, the second reflecting layer 60 is a Bragg reflecting layer. To further adjust the reflectance of the second reflecting layer 60, the second reflecting layer 60 has a multilayer structure.

In the present invention, a light-inducing layer 11 is provided between the substrate 10 and the second reflecting layer 60 to induce more light onto the light-inducing layer 11, thereby increasing the light emission efficiency at the back of the chip.

Specifically, the refractive index of the light-inducing layer 11 is smaller than that of the substrate 10. As the chip needs to be packaged subsequently, the refractive index of the light-inducing layer 11 is greater than that of the packaging glue. According to the constructive interference formula $d=k\lambda/2n_1$ k=1, 2 . . . and the destructive interference formula $d=(2k+1)\lambda/4n_1$ k=0, 1, 2 . . . , it can be concluded that when $d=\lambda/4n_1$ or $d=3\lambda/4n_1$, that is, when the thickness of the light-inducing layer=(wavelength)/(4*the refractive index of the light-inducing layer), that is, when the wavelength of the emitting light is an integer multiple of the thickness of the light-inducing layer, the light-inducing layer can induce the light from the substrate to the light-inducing layer to allow anti-reflection.

To make sure the light-inducing layer has good refractive ability and light-emitting ability, the light transmittance of the light-inducing layer of the present invention must be greater than 99%. If the light transmittance of the light-inducing layer is less than 99%, the light emission efficiency of the chip is reduced. Therefore, the light-inducing layer is made from a light-transmitting material, which is made from one or more materials selected from the group consisting of $Al_2O_3$, $SiO_2$, $SiN_x$, $MgF_2$, $TiO_2$, and $Ti_2O_5$.

The refractive index of the packaging glue is generally 1.4-1.5, the refractive index of the sapphire substrate is 1.7. Therefore, the refractive index of the light-inducing layer of the present invention is 1.4-1.7.

It should be noted that the light-inducing layer of the present invention may have a single-layer structure or a multilayer structure; the light emission efficiency of the multilayer structure is better than that of the single-layer structure.

Preferably, the light-inducing layer includes a first light-emitting layer 11a, a second light-emitting layer 11b, and a third light-emitting layer 11c, which are consecutively disposed on the substrate, wherein the refractive index of the packaging glue<the refractive index of the third light-emitting layer 11c <the refractive index of the second light-emitting layer 11b <the refractive index of the first light-emitting layer 11a <the refractive index of the substrate 10. The refractive index of each of the three-layered light-inducing layer described above decreases consecutively from the side of the substrate to the side of the packaging glue. Compared with a single-layered light-inducing layer, the gradual decrease of the refractive index could further reduce total reflection and increase light emission efficiency. If the light-inducing layer comprises more than three layers, part of the light emitted would be blocked and absorbed, in turn reducing the light emission efficiency of the chip. Compared with the single-layered light-inducing layer, the light emission efficiency of the three-layered light-inducing layer can be increased by 5%.

Preferably, the refractive index of the first light-emitting layer is 1.6-1.7, the refractive index of the second light-emitting layer is 1.5-1.6, and the refractive index of the third light-emitting layer is 1.4-1.5.

More preferably, as an existing LED chip generally employs a sapphire substrate, to reduce cost and to simplify the production process, the light-inducing layer of the present invention includes a first $Al_2O_3$ layer, a second $Al_2O_3$ layer, and a third $Al_2O_3$ layer consecutively disposed on the sapphire substrate, wherein the refractive index of the packaging glue<the refractive index of the third $Al_2O_3$ layer<the refractive index of the second $Al_2O_3$ layer<the refractive index of the first $Al_2O_3$ layer<the refractive index of the substrate. As the substrate and the light-inducing layer are both made from $Al_2O_3$, the stress between the substrate and the light-inducing layer can be reduced. In addition, since the first light-emitting layer, the second light-emitting layer, and the third light-emitting layer are all made from $Al_2O_3$, during formation, the refractive index of each light-emitting layer can be adjusted by adjusting the thickness of each light-emitting layer and the ratio between Al and O during formation. The aforementioned light-inducing layer has a simple structure and a simple production process, is low in cost and is easy to produce.

As another preferred solution of the light-inducing layer, the light-inducing layer includes an $Al_2O_3$ layer, a $SiO_2$ layer, and a $MgF_2$ layer consecutively disposed on the sapphire substrate, wherein the refractive index of the packaging glue< the refractive index of the $MgF_2$ layer<the refractive index of the $SiO_2$ layer<the refractive index of the $Al_2O_3$ layer <the refractive index of the substrate. The $Al_2O_3$ layer is the bottom layer and is placed between the substrate and the $SiO_2$ layer for buffering and supporting; the middle $SiO_2$ layer not only contributes to a desirable refractive index, its thickness can also be made small to prevent undesirable light absorption. The $MgF_2$ layer has a relatively low refractive index and a relatively small thickness, allowing better light transmittance.

As a preferred embodiment of the present invention, a plurality of holes is provided on the light-inducing layer 11 to allow the outflow of light from the light-inducing layer, thereby increasing light emission efficiency of the chip, increasing the brightness of the chip.

Figure 3:
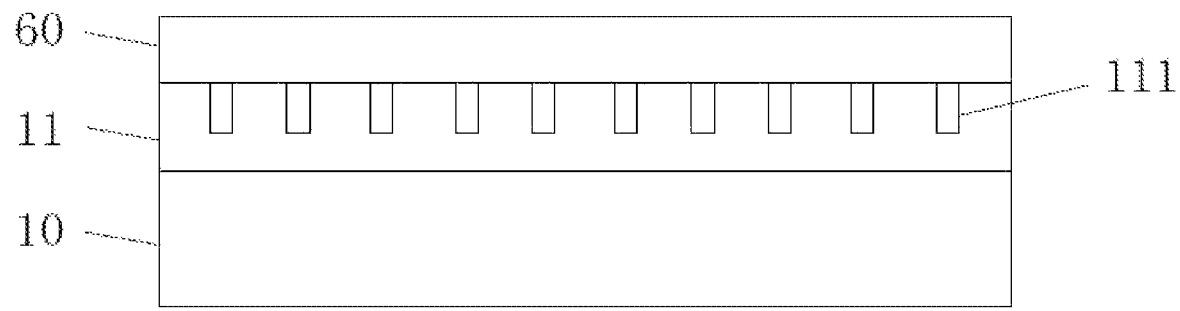
FIG. 3 is a diagram showing the first embodiment of holes at the light-inducing layer of the present invention.
Figure 4:
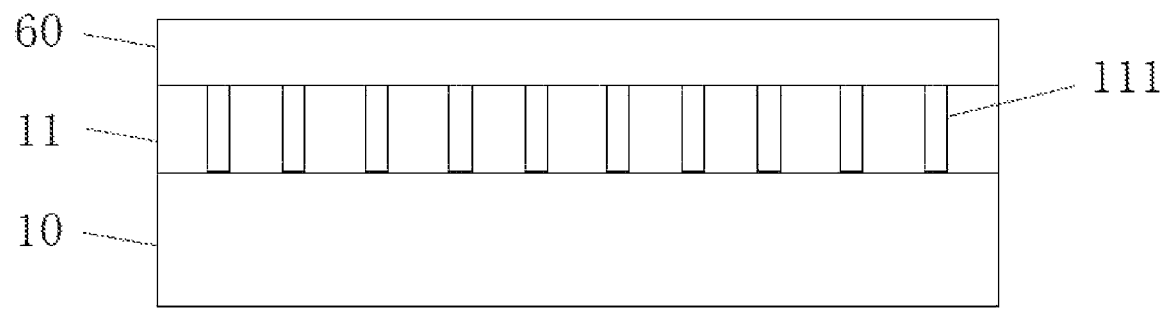
FIG. 4 is a diagram showing the second embodiment of holes at the light-inducing layer of the present invention.
Figure 5:
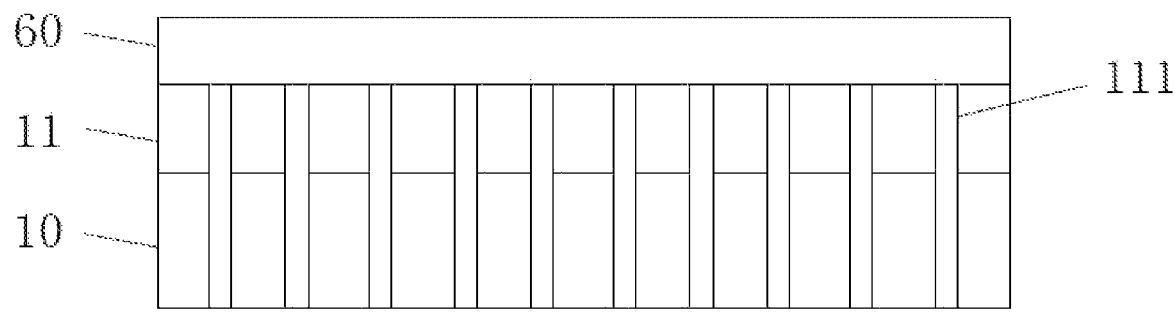
FIG. 5 is a diagram showing the third embodiment of holes at the light-inducing layer of the present invention.

Referring to FIG. 3, the holes 111 may be formed by etching from the surface of the light-inducing layer 11 to the inside of the light-inducing layer 11; or, referring to FIG. 5, the holes 111 may penetrate from the surface of the light-inducing layer 11 to the back surface of the substrate 10; or, referring to FIG. 4, the hole 111 may penetrate from the surface of the light-inducing layer 11 to the surface of the substrate 10. The depth of the holes of the light-inducing layer of the present invention has an important effect on the light emission efficiency of the chip. The light emission efficiency of the chip of FIG. 5>the light emission efficiency of the chip of FIG. 4>the light emission efficiency of the chip of FIG. 3.

In addition, the diameter of the holes of the light-inducing layer also has an important effect on the light emission efficiency of the chip. Preferably, the wavelength of the light emitted from the active layer is an integer multiple of the hole diameter. When the hole diameter is correlated to an integer multiple of the wavelength of the light emitted, the outflow of will be easier, the chip will appear brighter.

The first electrode 71 is electrically connected to the first semiconductor layer 21, the second electrode 72 is electrically connected to the transparent conductive layer 30, and the first electrode 71 and the second electrode 72 are insulated from each other. The first electrode 71 and the second electrode 72 are each made from one or more metals selected from the group consisting of Cr, Al, Ni, Ti, Pt, and Au.

The flip-chip LED chip of the present invention further includes a first bonding pad and a second bonding pad. The first bonding pad is disposed on the first electrode 71 and is electrically connected to the first electrode 71. The second bonding pad is disposed on the second electrode 72 and is electrically connected to the second electrode 72.

Accordingly, the present invention provides a method for producing a flip-chip LED chip used in a backlight, which includes the following steps:

S101: forming an epitaxial layer on a substrate, the epitaxial layer includes a first semiconductor layer, an active layer, and a second semiconductor layer consecutively disposed on the substrate.

S102: forming a transparent conductive layer on the epitaxial layer by evaporation deposition through an electron-beam evaporation process; a photoresist or $SiO_2$ is employed as a mask.

The material of the transparent conductive layer is indium tin oxide, but it is not limited thereto. The ratio of indium to tin in indium tin oxide is 70-99: 1-30. Preferably, the ratio of indium to tin in indium tin oxide is 95:5. This allows the conductivity of the transparent conductive layer to increase, prevents the carriers from clustering, and increases the light emission efficiency of the chip.

S103: forming an insulating layer on a surface of the transparent conductive layer via a chemical vapor deposition process or a physical vapor deposition process. The insulating layer covers a surface of the transparent conductive layer. The insulating layer is used to protect the epitaxial layer; as a result, the first electrode and the second electrode are insulated from each other, preventing the chip from forming a short circuit. Preferably, the insulating layer is made from one or more materials selected from the group consisting of $SiO_2$, $Si_3N_4$, $Al_2O_3$, $TiO_2$, and $Ta_2O_3$.

S104: depositing a first reflecting layer on the surface of the transparent conductive layer via an electron beam evaporation process or a magnetron sputtering deposition process.

S105: forming a light-inducing layer on the back surface of the substrate by evaporation, sputtering, or coating.

Preferably, a laser or a chemical etching process is used to etch the light-inducing layer to form a plurality of holes. Specifically, the holes are etched from the surface of the light-inducing layer to the inside of the light-inducing layer, or the holes penetrate from the surface of the light-inducing layer to the back surface of the substrate, or the holes penetrate from the surface of the light-inducing layer to the surface of the substrate.

S106: depositing a second reflecting layer on the back surface of the substrate through an electron beam evaporation process or a magnetron sputtering deposition process.

S107: forming a first electrode, a second electrode, a first bonding pad, and a second bonding pad.

The disclosure above is only a preferred embodiment of the present invention. The scope of the present invention is not limited by this disclosure. Therefore, equivalent substitutions made according to the claims of the present invention still fall within the scope of the present invention.

What is claimed is:

1. A flip-chip LED chip used in a backlight, characterized in that it comprises a substrate, an epitaxial layer, a transparent conductive layer, an insulating layer, a first reflecting layer, a second reflecting layer, a first electrode, and a second electrode; the epitaxial layer is disposed on a surface of the substrate, the transparent conductive layer is disposed on the epitaxial layer, the insulating layer is disposed on the transparent conductive layer, the first reflecting layer is disposed on the insulating layer, and the second reflecting layer is disposed on a back surface of the substrate; the first electrode is electrically connected to the epitaxial layer, the second electrode is electrically connected to the transparent conductive layer; reflectance of the second reflecting layer is greater than that of the first reflecting layer, and the reflectance of the first reflecting layer is less than or equal to 80%; after light emitted from the epitaxial layer is reflected by the first reflecting layer and the second reflecting layer, 20% to 40% of the light is emitted from a back surface of the chip, and 60% to 80% of the light is emitted from a side of the chip;

wherein the flip-chip LED chip comprises a light-inducing layer, the light-inducing layer is disposed between the substrate and the second reflecting layer, a refractive index of the light-inducing layer is smaller than that of the substrate, and a wavelength of light emitted from the epitaxial layer is an integer multiple of a thickness of the light-inducing layer;

the light-inducing layer has a multi-layer structure;

the light-inducing layer comprises a first light-emitting layer, a second light-emitting layer, and a third light-emitting layer that are consecutively disposed on the substrate, wherein a refractive index of the third light-emitting layer<a refractive index of the second light-emitting layer<a refractive index of the first light-emitting layer<a refractive index of the substrate.

2. The flip-chip LED chip used in the backlight according to claim 1, characterized in that the substrate is a sapphire substrate; the light-inducing layer includes a first Al2O3 layer, a second Al2O3 layer, and a third Al2O3 layer consecutively disposed on the sapphire substrate, wherein a refractive index of the third Al2O3 layer<a refractive index of the second Al2O3 layer<a refractive index of the first Al2O3 layer<a refractive index of the sapphire substrate.

3. The flip-chip LED chip used in the backlight according to claim 1, characterized in that the substrate is a sapphire substrate; the light-inducing layer includes an Al2O3 layer, a SiO2 layer, and a MgF2 layer consecutively disposed on the sapphire substrate, wherein a refractive index of the MgF2 layer<a refractive index of the SiO2 layer<a refractive index of the Al2O3 layer<a refractive index of the sapphire substrate.

4. The flip-chip LED chip used in the backlight according to claim 1, characterized in that a hole is provided in the light-inducing layer, the hole penetrates from a surface of the light-inducing layer to an inside of the light-inducing layer; or the hole penetrates from the surface of the light-inducing layer to the back surface of the substrate; or the hole penetrates from the surface of the light-inducing layer to the surface of the substrate.

5. The flip-chip LED chip used in the backlight according to claim 1, characterized in that the first reflecting layer is a Bragg reflecting layer, and is made from one or more materials selected from the group consisting of $SiO_2$, $Si_3N_4$, $Al_2O_3$, $TiO_2$, and $Ta_2O_3$.

6. The flip-chip LED chip used in the backlight according to claim 5, characterized in that the second reflecting layer is a Bragg reflecting layer or a metal reflecting layer, and is made from one or more materials selected from the group consisting of $SiO_2$, $Si_3N_4$, $Al_2O_3$, $TiO_2$, $Ta_2O_3$, Al, and Ag.

7. The flip-chip LED chip used in the backlight according to claim 1, characterized in that reflectance of the first reflecting layer to light having a wavelength of 400-500 nm is less than 80%.

8. A method for producing the flip-chip LED chip used in the backlight according to claim 1, characterized in that the method comprises:
Forming an epitaxial layer on a surface of a substrate;
Forming a transparent conductive layer on the epitaxial layer;
Forming an insulating layer on the transparent conductive layer;
Forming a first reflecting layer on the insulating layer;
Forming a second reflecting layer on a back surface of the substrate, reflectance of the second reflecting layer is greater than that of the first reflecting layer, and reflectance of the first reflecting layer is less than or equal to 80%;
Forming a first electrode and a second electrode.

9. The method for producing a flip-chip LED chip used in the backlight according to claim 8, characterized in that forming a light-inducing layer on the back surface of the substrate before forming the second reflecting layer; forming the second reflecting layer on the light-inducing layer.

* * * * *